United States Patent [19]

Gray

[11] 4,337,221
[45] * Jun. 29, 1982

[54] METHOD OF MAKING THERMOCOUPLES AND PRODUCTS THEREOF

[76] Inventor: Adrian L. Gray, 3 Kruger Dr., Craighall Park, Johannesburg, Transvaal Province, South Africa

[*] Notice: The portion of the term of this patent subsequent to Jan. 19, 1995, has been disclaimed.

[21] Appl. No.: 43,489

[22] Filed: May 29, 1979

Related U.S. Application Data

[63] Continuation-in-Part of Ser. No. 870,663, Jan. 19, 1978, Pat. No. 4,241,003.

[51] Int. Cl.³ .......................... B29C 6/04; B29C 1/02
[52] U.S. Cl. .................... 264/102; 264/235; 264/238; 264/254; 264/262; 264/272.12; 264/337; 136/234
[58] Field of Search ............... 264/272, 275, 102, 235, 264/238, 254, 262, 337, 272.12, 272.15, 272.17; 136/232, 234; 29/573

[56] References Cited

U.S. PATENT DOCUMENTS

| 2,286,515 | 6/1942 | Stupakoff | 264/275 |
|---|---|---|---|
| 2,643,418 | 6/1953 | Auldridge | 264/275 |
| 3,024,295 | 3/1962 | Moore | 136/234 |
| 3,109,201 | 11/1963 | Dulmage | 264/275 |
| 3,298,874 | 1/1967 | Davies | 136/232 |
| 3,367,025 | 2/1968 | Doyle | 264/272 |
| 3,427,208 | 2/1969 | Lowdermilk | 136/235 |
| 3,531,331 | 9/1970 | Davies | 136/235 |
| 3,698,954 | 10/1972 | Jonet, Jr. | 136/234 |
| 3,816,183 | 6/1974 | Kraus | 136/232 |

FOREIGN PATENT DOCUMENTS

| 53-43188 | 9/1973 | Japan | 264/275 |
|---|---|---|---|
| 999798 | 7/1965 | United Kingdom | 136/234 |
| 1025026 | 4/1966 | United Kingdom | 136/234 |

OTHER PUBLICATIONS

Leeds & Northrup, Circular on "Temtip", 11/1960.

Primary Examiner—James B. Lowe
Attorney, Agent, or Firm—Weiser, Stapler & Spivak

[57] ABSTRACT

A high-temperature thermocouple is made by placing a u-tube containing a bi-metal junction in a mould, positioned to locate the u projecting through the face portion of the mould, holding other non-ceramic parts of the thermocouple in the mould, and filling the mould with ceramic. The mould is elastically deformable at least where it holds the u-tube, and the ceramic extends into the u-tube ends. Also the product made by the described method.

9 Claims, 4 Drawing Figures

METHOD OF MAKING THERMOCOUPLES AND PRODUCTS THEREOF

This application is a continuation-in-part of Ser. No. 870,663, filed Jan. 19, 1978, now U.S. Pat. No. 4,241,003.

This invention relates to thermocouples and more particularly to a disposable thermocouple unit for use with a suitable lance holder or the like and associated instruments in the manufacture of steels and other metals.

Thermocouple units of this type are extensively used in industry to obtain temperature records of baths of molten metal, particularly steel, during reduction or alloying processes. A lance holder is used which incorporates electrically conducting contacts and leads, so that the heat-generated electro-motive force in the thermocouple can be conducted to suitable recording units. A thermocouple unit is mounted on the end of the lance holder, and after immersion in a bath of molten metal and a recording has been made of the temperature, the thermocouple unit is withdrawn from the bath and removed from the end of the manipulating lance holder. The type of unit with which this invention is concerned is primarily intended to be used once only, then replaced with a new unit. However, it may be, and often is, used more than once.

In the production of steel, maintaining proper tolerances in the measurement of temperature is essential. Temperatures up to 1700° C. must be measured, and the tolerance of these temperatures must be maintained to ±10° C. during the refining cycle, and to ±3° C. thereafter. Consequently, it becomes important to produce a thermocouple unit which is extremely accurate, but which is not prohibitive in cost.

There are many known thermocouple units which are intended for this purpose, furthermore, a considerable number of these are variations of the particular type forming the basis of this invention.

In this type of thermocouple unit the bi-metal, or hot, function is usually a platinum versus platinum/rhodium junction and is located in a quartz glass u-tube at the central part opposite the two ends thereof. The two thermocouple wires project from the two open ends of the u-tube.

Both open ends are embedded in a mass of suitable ceramic material such that the central part of the u-tube containing the hot junction projects from the front end of the unit. This ceramic material acts inter alia as a heat shield for the wires and any intermediate junctions of the thermocouple wires. The distance between the surface of the ceramic material and the projecting end of the u-tube (and hence the hot junction) is hereafter termed the "air gap" of the thermocouple unit. Consistency in the size of the air gap is an acknowledged essential requirement in the construction of this type of unit, as seemingly small variations can result in relatively large variations in temperature recordings obtained from the thermocouples in use.

Lack of consistency and accuracy in the results obtained from the thermocouple units can often be traced to imprecise manufacture, for example, variation in the air gap, cavities in the ceramics material, and undesirable work-hardening of the thermocouple wires with insufficient subsequent annealing.

Opposite the u-tube and also embedded in the ceramics there is generally a member of electrically non-conducting material locating the two thermocouple wires or extension leads joined to them. This enables the thermocouple to be automatically electrically connected to suitable indicating units when the thermocouple unit is fixed to the end of the manipulating lance holder. The member is generally in the form of a socket, preferably formed of plastic into which is inserted a corresponding electrically conducting probe carried by the lance holder.

One previously used manufacturing procedure entails manually locating the u-tube, previously threaded with the hot junction, in the correct position in the top of a plastics component. This latter component may conveniently be positioned in a suitable jig. The intermediate junctions of the thermocouple wires and the extension leads are located within the component with the socket member referred to above projecting from the rear thereof and locating the extension leads. The component is then filled with ceramics material which is allowed to partially set before being removed from the jig. Use of the plastics material components does not readily permit employment of annealing techniques after the ceramics material has set.

In other previously used manufacturing techniques, metal or the like moulds are used to mould the ceramics material. However, this procedure has been found generally unsatisfactory and difficulties have been encountered in the provision of resilient portions in the dies to protect the u-tube. A high rate of production necessitates the rapid removal of the partially set units from the dies with a consequently high post-moulding loss rate. Furthermore, the moulds must often be coated with a suitable release agent prior to moulding. This is not only a time consuming procedure but release agents used to date have not effectively stopped a high proportion of wastage being caused by the ceramic material sticking to the moulds.

An object of this invention is thus to provide an improved method and apparatus for manufacturing thermocouple units of the type broadly described above.

Another object of this invention is to provide improved thermocouple units of the type broadly described above.

According to one aspect of the invention a mould for use in manufacturing thermocouple units having a hot junction located in a glass u-tube to project from a body of ceramic material comprises a mould for a thermocouple unit formed in at least two mould members of mouldable material, the members including means for locating and holding the non-ceramic components of the thermocouple in accurate spaced relation to each other prior to introduction of the ceramic material.

Further according to the invention the mould material is an elastically deformable plastics material such as an impermeable foamed or expanded plastics material, and is preferably expanded polystyrene. The mould members further include provision for introducing the ceramics material into the mould cavity, preferably from that end of the mould cavity corresponding to the end of the thermocouple unit remote from the bi-metal junction thereof.

Still further according to the invention there are two mould members which are preferably symmetrical; the two mould members co-operating to form multiple adjacent and parallel mould cavities in parallel relationship. Preferably the mould cavities are located in opposite faces of a block of suitable material to enable sets of moulds to be formed when the blocks are stacked together.

The invention also provides that the mould forms the packaging material for transport of thermocouple units or the non-ceramic components thereof, which packaging material may be disposable.

According to a second aspect of the invention a method of manufacturing thermocouple units comprises the steps of locating in spaced relationship the non-ceramic parts of each thermocouple unit in one of at least two co-operable mould members as defined above; closing the mould; introducing liquid ceramics material into the mould cavities formed by the cooperating members; and allowing the ceramics material to set.

According to a third aspect of the invention, the introduction of the liquid ceramics material takes place under such circumstances that the ceramic enters the ends of the glass u-tube and fills these ends to such a distance as to also project from the remainder of the ceramic body, but not as far as the bi-metal junction.

Further features provide for the ceramic material to be introduced into the mould from a point remote from the glass tube and under sufficient pressure to control the level of ceramic material introduced into the open ends of the tube.

This invention provides further a method of manufacturing thermocouple units using a mould and moulding method as above defined wherein the non-ceramic components are introduced in the mould and the latter closed and dispatched for the introduction of ceramic material at another location.

A preferred embodiment of the invention, described by way of example only, follows with reference to the accompanying drawings in which.

The same reference numerals are used in the various Figures to denote similar elements. The various Figures provided are not drawn to the same scale.

Figure 2:
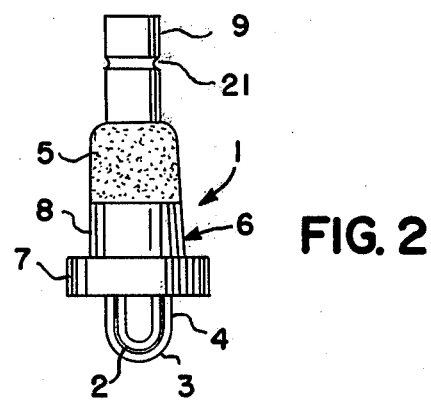
FIG. 2 is a side elevation of a thermocouple unit.

In this embodiment of the invention a mould is provided for use in manufacturing a disposable thermocouple unit 1 as indicated in FIG. 2. The unit consists of a bi-metal junction 2, for example a platinum versus platinum/rhodium junction centrally located in the bend 3 of a glass u-tube 4. Both ends of the u-tube are embedded in a mass of ceramic material 5. In the regions adjacent to the u-tube the ceramic material is partially enclosed by a thin-walled plastics collar 6 which has a flanged portion 7 and a projecting smaller diameter short frustro-conical portion 8. The collar 6 is open at both ends allowing the ceramic material in the collar to project from the short portion 8 in an extended frustro-conical configuration.

Projecting co-axially from the end of the exposed section of ceramics is a hard plastics tube 9 which has one end embedded in the ceramics. The inside of the end portion 10 of the tube carries the free ends of a pair of extension leads 11, the other ends of the leads being connected to the ends of the platinum and platinum/rhodium wires 2a and 2b (See FIG. 4) respectively to form the intermediate junctions. These latter connections are preferably located within the ceramic mass 5, and furthermore, the extension leads may take the form of compensating leads if this is required.

In use the thermocouple unit is adapted to have a cylindrical cardboard tube fixed to extend co-axially from behind the flange portion 7 of the collar 6. This tube then fits over the end of a suitable lance holder or probe with the plastics tube 10 forming a suitable socket for the lance holder such that the thermocouple is electrically connected to its associated apparatus. Collar 6, being formed of a plastics material, provides a convenient means for attaching the unit 1 to the cardboard tube using conventional adhesives. Although the cardboard tube could be attached directly to the ceramics, special adhesives would have to be used in such case.

Figure 3:
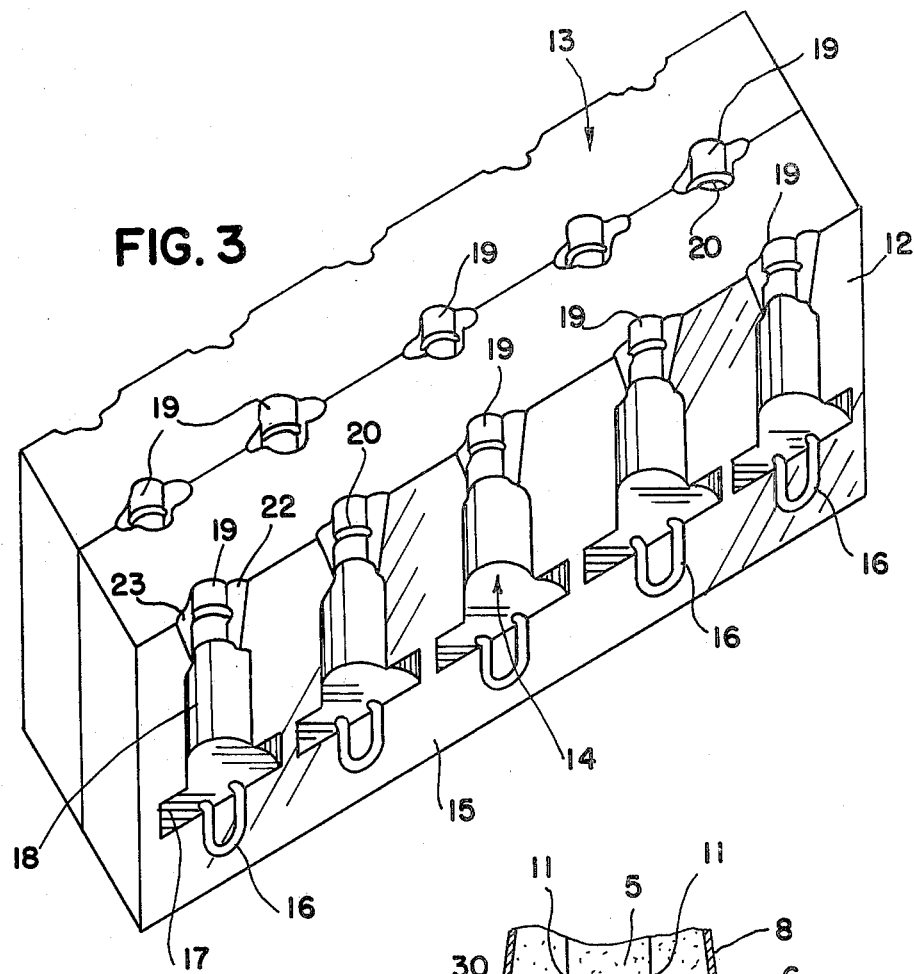
FIG. 3 is a view of a closed mould.

The mould for manufacturing the units is preferably made from foamed polystyrene and takes the form of a pair of similar, symmetrical mould cavities 14 formed in the faces of two rectangular blocks 13 of this material. In each block 13 there is a plurality (for example five) of adjacent and parallel mould cavities 14 as shown in FIG. 3. Each foamed polystyrene block 13 has five (or any other suitable number) mould cavities 14 in each of its two opposite faces 12. Furthermore, the mould cavities in one face are mirror images of the mould cavities in the other face. This arrangement enables the number of polystyrene blocks to be decreased significantly for a given number of moulds by stacking the blocks together.

Each mould cavity conforms to the configuration of the thermocouple unit as outlined above and depicted in FIG. 2. Thus there is a portion 16 for locating the glass u-tube, a portion 17 for locating the flange 7 of the collar 6, a portion 18 for forming the exposed truncated portion of the ceramics 5 and a neck portion 19 for locating the plastics tube 9. This neck portion 19 preferably has a semi-circular projection 20 which co-operates with a circular indentation 21 in the tube 9 such that it is located to project a required amount from the mould, as shown in the central mould cavity in which the non-ceramic parts of the thermocouple unit are depicted in position.

Adjacent to the neck portion 19 of each mould cavity 14 is a duct 22 for introduction of ceramic material, and an open riser 23.

It is not necessary that there be only two mould members and in some applications more, for example three, may be preferable.

Figure 1:
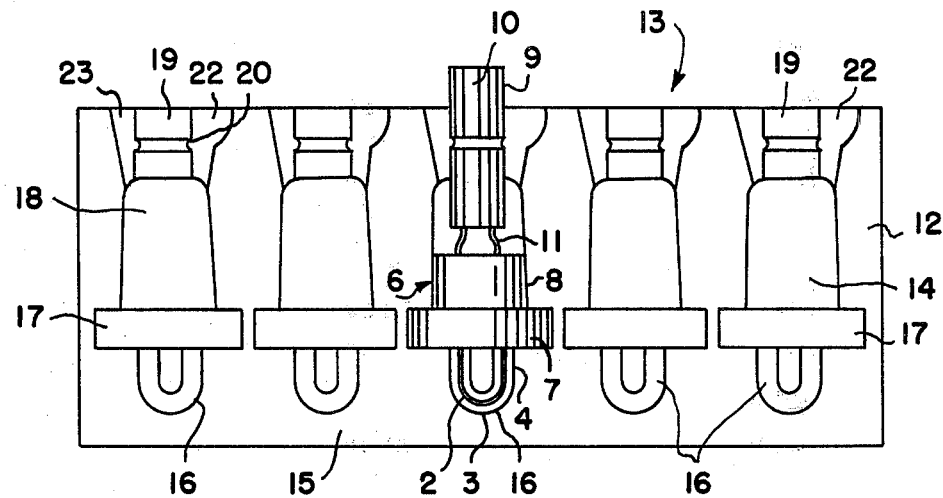
FIG. 1 is an elevation of a mould member including the non-ceramic components of a thermocouple unit in one of its mould cavities.

In use the non-ceramic parts of the thermocouple units are positioned in the mould cavities of one face 12 of a block as shown in the central mould cavity of FIG. 1. The two sets of mould cavities are brought together to close the mould and the parts mentioned are firmly held in position. In fact, the parts of the mould may be compressed so tightly as to become airtight. However, it is generally preferred to allow some air to escape, to allow the mould to be more uniformly filled by the ceramics, unless the mould is to be evacuated during production. If desired, additional sets of moulds may be closed by stacking the polystyrene blocks against each other as described above.

At this stage the moulds 14 are ready for the introduction of the ceramic material, which may take place immediately, or after storage or transport or both of the closed moulds. This enables the ceramic material to be moulded to complete the units at locations remote from where the non-ceramic components are assembled, while the accurate location of these components is maintained. This ability to complete formation of the units at remote locations includes locations at substantial distances from the point at which the components are placed into the moulds. This permits the shipment of such units, in an incomplete state, to other plants, countries, or continents, where the units could be completed by on-site, low cost, labor. Moreover, filling of the moulds to thereby complete the units contained therein may be performed at any time, and the units may therefore be stored in their incomplete state for substantial periods of time prior to their completion, if desired.

The ceramic material is introduced via duct 22. During introduction of the ceramic material into the mould, the mould cavities 14 preferably have their axes in a vertical orientation. The liquid ceramics flows to the bottom of the mould cavity and rises until it emerges from the open riser 23. By extending the height of the duct 22 and open riser 23 a pressure is provided in the mould to cause a small but certain amount of ceramics to be forced into the open ends of the u-tube. Because the moulds are disposable the ceramic is allowed to set, and the completed units stored, in their moulds for any length of time without effecting the rate of production of the units. Improved and more rapid introduction of the ceramic material may be achieved by first evacuating the moulds, as will be more fully described below.

As alternatives to the above embodiment the plastics section 6 of the unit may be entirely omitted with the whole unit, other than the u-tube, bi-metal junction and leads, made from ceramics; or the entire ceramics portion of the unit may be encased in plastics. In the latter instance only that end of the single plastics section adjacent the u-tube need be located in the mould which mould may then be correspondingly decreased in size.

Experiments have shown that expanded polystyrene constitutes an exceptionally good material for forming moulds for ceramic materials as the latter do not stick thereto and thus no release agents are required. Other materials may also be used for this purpose, one example being silicone rubber.

Moulding thermocouple units in this way has a number of advantages including the following:

Consistency in the size of the air gap is easily obtained as in each case the position of the u-tube and the ceramic material is defined by the mould. In this way the quality of the units is maintained no matter where or when the ceramic material is introduced into the mould.

Consistency in the size of the air gap is essential to the proper operation of the thermocouple unit 1. The temperatures of the molten metal approach 1700° C., yet the temperature at the body of the unit 1 may be on the order of 100°–150° C. Thus, in the span of the air gap, which is typically on the order of 10 cm., the temperature will vary considerably. Moreover, the relatively cool ceramics body acts as a heat sink with respect to the molten metal, which can actually affect the temperature reading at the hot junction of the thermocouple 2, should the air gap not be precisely placed. The mould of the present invention permits such precise control, even in the production of such units 1 in quantity.

As mentioned previously, the plastics sleeve 6 of the units may be omitted from the moulding procedure. Units produced in this manner may be heated to anneal the metallic components which may have work-hardened during fabrication as follows. The hot junction in the quartz glass 4 is first located in a suitable expanded polystyrene mould and the flanged portion only, at 7, is cast in ceramics. After this stage the partially cast unit is removed from the mould and heated to a sufficient temperature to anneal the metallic components. Thereafter the partial unit is relocated in the mould as described above, together with the plastic tube 9. The remainder of the ceramics material is then cast. In this way the moulding is carried out in two stages. Obviously more stages may be provided if necessary.

By moulding with the mould cavities 14 in a vertical orientation, with the ducts 22 and risers 23 facing upwardly, the denser ceramic material is located in the area adjacent the u-tube if any air bubbles are trapped during introduction of the ceramics. Furthermore, some ceramics may be forced into the ends of the u-tube by providing suitable risers to the mould. This ensures that a good seal is obtained around the ends of the u-tube.

Apart from the advantages of moulding in general, the use of expanded polystyrene moulds as provided by this invention provides several advantages other than those mentioned above relating to its non-adhesive nature with respect to ceramics.

In the first place, the moulds are inexpensive. Thus, they may be used as storage containers for the units and may be thrown away when empty.

Secondly, as the units may be kept in their moulds for reasonably long periods and as polystyrene is impermeable to water, the moisture in the ceramics is retained during the curing process with the result that the strength characteristics of the ceramic material is improved.

Although it is preferable to retain moisture in the ceramics during the curing process, it has been found to be equally preferable to remove this moisture from the ceramics after the curing process.

During curing, moisture reacts with other constituents within the ceramics to form acids which serve as bonding agents. Such hydraulic bonding is facilitated as moisture retention within the mould during the curing process is increased. The use of polystyrene, which is impermeable to air and water, aids in the retention of moisture in the ceramics as they cure, increasing the strength of the resulting unit.

However, prior to use of the thermocouple unit, it has been determined that the moisture which was previously retained in the ceramics must be driven off for proper operation of the unit. Since moisture acts as a conductor of electricity, and since the voltages produced by the thermocouple junction are small, moisture retained within the ceramics tends to produce a high resistance short-circuit which is sufficient to cause the production of an unstable, noisy output signal. In order to improve the signal produced, the water retained in the ceramics during curing must be driven off. Moreover, once driven off, moisture must not be allowed to again contaminate the thermocouple unit. The use of polystyrene, which is impermeable to air and water, also assists in this function.

To further reduce moisture picked up by the thermocouple unit, it is also possible to apply a water repellent to the u-tube 4 during production, without affecting ultimate operation of the thermocouple unit 1.

Thirdly, the mouldable or elastically deformable nature of the expanded polystyrene ensures a good seal around the glass u-tube during the moulding process and also decreases the number of u-tube breakages and consequently useless thermocouples.

As mentioned before, the non-ceramic parts of the units are immovably located in the moulds and thus there is no necessity for immediate introduction of the ceramics. The incomplete units may thus be transported and exported from one country to another prior to the introduction of the ceramic material thus reducing transport costs. Furthermore, skilled or intensive labour is not required for the maintenance of quality control and in the case of exportation a local material and labour content is introduced into the final unit.

Other embodiments are envisaged within the scope of the invention.

Figure 4:
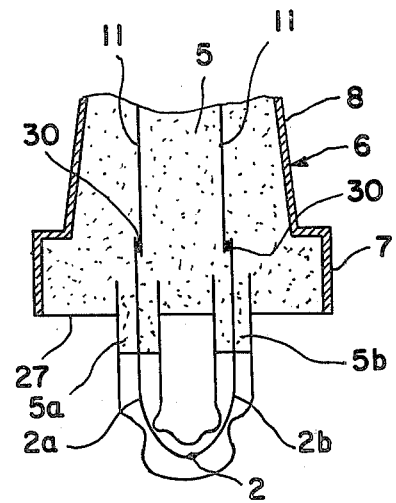
FIG. 4 is partial cross sectional view of the thermocouple unit of FIG. 2.

For example, although it is not absolutely essential for proper operation of the present invention, it has been determined that a major and unexpected further improvement is obtained by having the ceramics material 5 penetrate into the open end portions of the u-tube 4, as illustrated in FIG. 4. Indeed it is possible to have this penetration occur to such an extent that portions of the ceramics material actually protrude beyond the surface of the main body of the ceramics 5, as shown at 5a in FIG. 4. Close control of the extent to which this penetration occurs has been found to be important in reducing temperature gradients between the intermediate junctions 30, and to equalize the lengths of the leads 2a, 2b of the thermocouple, thereby reducing the problem of noise in the signal produced by the thermocouple 2.

Although it would be expected that the presence of ceramics material 5a within the u-tube 4 would act as a heat sink, thereby hindering performance of the thermocouple, it has surprisingly been determined that such penetration actually improves performance of the unit. The air gap of the resulting unit remains essentially unaffected by the presence of ceramics material 5a in the u-tube 4, being determined only by the distance between the hot junction 2 and the flat surface 27, or face, of the main body of the thermocouple unit 1, not the column of ceramics 5a in the u-tube 4. (See FIG. 4).

Allowing ceramics material 5a to penetrate u-tube 4 provides additional insulation between the thermocouple hot junction 2, and the intermediate junctions 30 which are formed when wires 11 are connected to the leads 2a, 2b of thermocouple 2.

In this manner, temperature gradients between the intermediate junctions 30 are reduced, improving the accuracy of the resulting signals.

Moreover, it also becomes possible to shorten the lengths of the respective leads 2a, 2b of the thermocouple 2, by moving the intermediate junctions 30 closer toward the hot junction of the thermocouple 2. The amount of wire used to form thermocouple 2 may therefore be reduced, without affecting the performance of the unit 1. In view of the fact that the wires used to form the thermocouple 2 are generally formed of the very costly materials platinum and platinum/rhodium, the shortening of these wires affords a substantial reduction in production costs. These savings increase as the ceramics 5a are allowed to penetrate further and further into the u-tube 4. The intermediate junctions 30 may then be moved correspondingly closer and closer to the hot junction, even to the point of being positioned inside the u-tube itself.

The degree of penetration of ceramics 5a into u-tube 4 is essentially controlled by pressure, primarily that of the ceramics material as it is introduced into the duct 22 of mould cavity 14. This degree of penetration may be varied as desired, by varying the pressure, however this penetration must stop short of the thermocouple hot junction itself, to assure proper operation of the unit 1.

As the degree of penetration is increased, it becomes advisable, and at a certain point necessary, to at least partially evacuate the u-tube 4 prior to introduction of the ceramics 5 into the mould cavity 14, to overcome the back pressure which would otherwise be produced by air trapped in the bend 3 of the u-tube 4.

In order to assist in the production of such units, it is helpful, although not required, to crimp the u-tube 4 at selected positions, such as are shown in FIG. 4 at 25. This is particularly desirable when the u-tube 4 is to be fully evacuated prior to introduction of the ceramics therein. By crimping the u-tube, the hot junction of the thermocouple is maintained in its exposed condition, and the degree of penetration of the ceramics 5 into the u-tube is definitely limited. This limitation relates to both the degree of penetration of the ceramics 5a into the u-tube 4, as well as enabling the equalization of the lengths of the legs 2a, 2b of the thermocouple which remain exposed. Controlling both of these parameters is important in obtaining the accurate, low-noise signals necessary for precise temperature measurement.

In production, the elements comprising the thermocouple unit would be inserted into mould cavity 14 as previously described. The u-tube 4 would previously have been suitably crimped. The two halves of the mould 14 would then be closed upon each other. Due to the impermeability to air of the material used to form the mould, the closed mould could then be evacuated. The ceramic 5 would then be poured.

In this manner, the ceramic 5 would form the main body of the unit, and the ceramic 5a would penetrate the u-tube up to the crimped portions 25 of the u-tube. A uniform product results.

Evacuating the mould provides several advantages during the manufacturing process. Evacuating the mould reduces trapped air which could potentially inhibit the uniform filling of the mould cavities 14 by the ceramic 5. Further, using the techniques of the prior art, it has proven difficult to fill more than two mould cavities 14 in series due to the uneven pressures which result as one progresses from those cavities 14 closest to the point at which the ceramic is introduced, to those cavities which are farthest away. Evacuating the mould has been found to substantially eliminate this problem, enabling a plurality of thermocouple units to be uniformly moulded, in series.

What is claimed is:

1. A method for the production of a thermocouple unit having a bi-metal junction located in a glass u-tube, having a pair of open ends, to project from the front face of a body of a ceramics material, which method comprises, placing the glass u-tube into a mould for use in manufacturing the thermocouple unit, the mould having at least two co-operable mould members, each having a centrally positioned cavity defined by the walls of the mould, the cavity having a body producing portion and a front face producing portion, and means for positioning with respect to the front face producing portion of the cavity, the glass u-tube, such that both open ends of the glass u-tube are positioned within the body producing portion of the mould, and such that the bend of the u-tube is positioned outside of the body producing portion of the mould at a selected distance, closing the mould members onto each other, introducing the ceramics material into the closed cavity under pressure in such manner that it enters the open ends of the glass u-tube, controlling the distance by which the ceramics material enters the glass u-tube, and prior to positioning the glass u-tube into the u-tube positioning means crimping the glass u-tube on both sides of the point at which the bi-metal junction is located.

2. A method for the production of a thermocouple unit having a bi-metal junction located in a glass u-tube, having a pair of open ends, to project from the front face of a body of a ceramics material, which method comprises, placing the glass u-tube into a mould for use in manufacturing the thermocouple unit, the mould having at least two co-operable mould members, each having a centrally positioned cavity defined by the walls of the mould, the cavity having a body producing portion and a front face producing portion, and means for positioning with respect to the front face producing portion of the cavity, the glass u-tube, such that both open ends of the glass u-tube are positioned within the body producing portion of the mould, and such that the bend of the u-tube is positioned outside of the body producing portion of the mould at a selected distance, closing the mould members onto each other, opening the mould and removing the contents therefrom, after the contents have at least partially cured, heating the contents to a temperature sufficient to anneal the bi-metal junction, replacing the contents back into the cavity of the mould, positioning additional non-ceramic components into the cavity of the mould, and introducing additional ceramics material into the cavity of the mould thereby producing a finished thermocouple unit.

3. A method for the production of a thermocouple unit having a bi-metal junction located in a quartz glass u-tube anchored in a body of ceramic material by a pair of open ends and projecting from the front face of the ceramic material which method comprises:

placing the u-tube in sealing engagement with an elastically deformable portion of a mould positioned to locate the tube, the mould and deformable portion thereof having at least two co-operable mould members each having a cavity therein for forming complementary portions of a body portion and a front face portion such that the open ends of the u-tube are located in the body forming portion of the mould, placing other non-ceramic components of the unit in formations in the mould located to hold the components in fixed space relationship to each other, closing the mould and introducing liquid ceramic material into the mould to form the body and front face, the ceramic material being introduced into the mould to enter into the open ends of the glass u-tube to extend beyond the front face of the body, reducing the pressure in the mould prior to introducing the ceramic material therein, the u-tube having crimps formed therein spaced away from the open ends in the outwardly projecting portion thereof prior to placement in the mould, and allowing the ceramic material to set.

4. A method for the production of a thermocouple unit having a bi-metal junction located in a glass u-tube, having a pair of open ends, to project from the front face of a body of a ceramics material, which method comprises, placing the glass u-tube into a mould for use in manufacturing the thermocouple unit, the mould having at least two co-operable mould members, each having a centrally positioned cavity defined by the walls of the mould, the cavity having a body producing portion and a front face producing portion, and means for positioning with respect to the front face producing portion of the cavity, the glass u-tube, such that both open ends of the glass u-tube are positioned within the body producing portion of the mould, and such that the bend of the u-tube is positioned outside of the body producing portion of the mould at a selected distance, closing the mould members onto each other, and introducing the ceramics material into the closed cavity of the mould under pressure and in such manner that it enters the open ends of the glass u-tube.

5. The method of claim 4 further comprising controlling the distance by which the ceramics material enters the glass u-tube.

6. The method of claim 5 wherein the introducing of the ceramics material is so controlled that said material enters the glass u-tube for a distance which extends beyond the face producing portion of the cavity of the mould.

7. The method of claim 5 further comprising at least partially evacuating the glass u-tube for introduction of the ceramics material therein.

8. The method of claim 7 wherein a plurality of mould cavities are filled simultaneously.

9. A method for the production of a thermocouple unit having a bi-metal junction located in a quartz glass u-tube anchored in a body of ceramic material by a pair of open ends and projecting from the front face of the ceramic material which method comprises:

placing the u-tube in sealing engagement with an elastically deformable portion of a mould positioned to locate the tube, the mould and deformable portion thereof having at least two co-operable mould members each having a cavity therein for forming complementary portions of a body portion and a front face portion such that the open ends of the u-tube are located in the body forming portion of the mould, placing other non-ceramic components of the unit in formations in the mould located to hold the components in fixed space relationship to each other, closing the mould and introducing liquid ceramic material into the mould to form the body and front face, and allowing the ceramics material to set, the sealing engagement being effected through making the mould of suitably foamed or expanded polystyrene which is impermeable to air and water, whereby hydraulic bonding of the ceramic is facilitated through moisture retention within the mould.

* * * * *